United States Patent [19]

Eaton

[11] Patent Number: 4,724,528
[45] Date of Patent: Feb. 9, 1988

[54] BATTERY CHARGE LEVEL MONITOR IN A COMPUTER SYSTEM

[75] Inventor: John T. Eaton, Corvallis, Oreg.

[73] Assignee: Hewlett-Packard Company, Palo Alto, Calif.

[21] Appl. No.: 608,317

[22] Filed: May 8, 1984

[51] Int. Cl.$^4$ .............................. H02J 7/00; G06F 1/00
[52] U.S. Cl. ...................................... 364/715; 320/43; 364/900
[58] Field of Search ............... 364/715, 200 MS File, 364/900 MS File; 320/43, 44, 45

[56] References Cited

U.S. PATENT DOCUMENTS

| | | | |
|---|---|---|---|
| 4,387,334 | 7/1983 | Loper | 320/44 |
| 4,455,523 | 6/1984 | Koenck | 320/43 |
| 4,542,462 | 9/1985 | Morishita et al. | 320/43 |
| 4,553,081 | 11/1985 | Koenck | 320/43 |

FOREIGN PATENT DOCUMENTS 074444 3/1983 European Pat. Off. .
648936 4/1985 Switzerland .

OTHER PUBLICATIONS

Moreton, "Fuel Gauge for the Electric Car" *Proc. IEE*, vol. 119, No. 6, Jun. 1972, pp. 649–654.
Funkschaue, vol. 45, No. 6, Mar. 16, 1973, pp. 204–206; D. Rosner: "Batterie-Anzeige fur Taschenrechner".

*Primary Examiner*—David H. Malzahn
*Attorney, Agent, or Firm*—Douglas L. Weller

[57] ABSTRACT

A battery charge level monitor for a computing system is presented. The monitor stores a value representing the charge stored in a battery. The value is varied to take into account battery charge depletion resulting from operations by the computing system, and to take into account charge added to the battery by a recharger. An operator can access the value through computer commands or by automatic display of the value by the computing system.

3 Claims, 2 Drawing Figures

BATTERY CHARGE LEVEL MONITOR IN A COMPUTER SYSTEM

BACKGROUND

Many computing systems such as portable calculators and portable computers require an internal battery in order to operate independent from AC lines. The eventual discharge of the internal battery can cause problems for a computer system operator if sufficient warning of power loss is not given.

Traditionally, battery powered computer systems have only provided the user with a low battery indicator which informs the user when the voltage level of the battery falls below a predetermined value. This provides a warning to the user of imminent power loss, but does not allow for longer range anticipation of power loss.

Another method for monitoring battery discharge is for the user to set a timer immediately upon charging the battery. By referencing the timer the user can determine how long the computing system has been running since the battery was last recharged. This method unfortunately has many drawbacks. For instance, the user must intervene to reset the timer each time the battery is recharged. Failure to set the timer or improper setting of the timer results in inaccurate predictions of the time of power loss. Additionally, if an operator only partially charges the battery, he has no way of knowing how much charge has been placed in the battery, and therefore no reference point from which to estimate the time of power loss. Furthermore, this method does not take into account that some operations in a computing system consume more power than other operations. Failure to take this into account again results in inaccurate predictions of the time of power loss.

SUMMARY OF THE INVENTION

In accordance with the preferred embodiment of the present invention, a battery charge level monitor for a computing system is presented. The monitor stores a charge value which represents the amount of charge within an internal battery within the computing system. The charge value is varied to take into account the amount of charge consumed by computer operations, and the amount of charge replenished by a battery recharger. The charge value is readily accessible by a computer operator, thus providing him with accurate information concerning the charge within the battery and allowing the operator to more accurately estimate the amount of operations which may be done before power loss occurs.

DESCRIPTION OF THE PREFERRED EMBODIMENT

Figure 1:
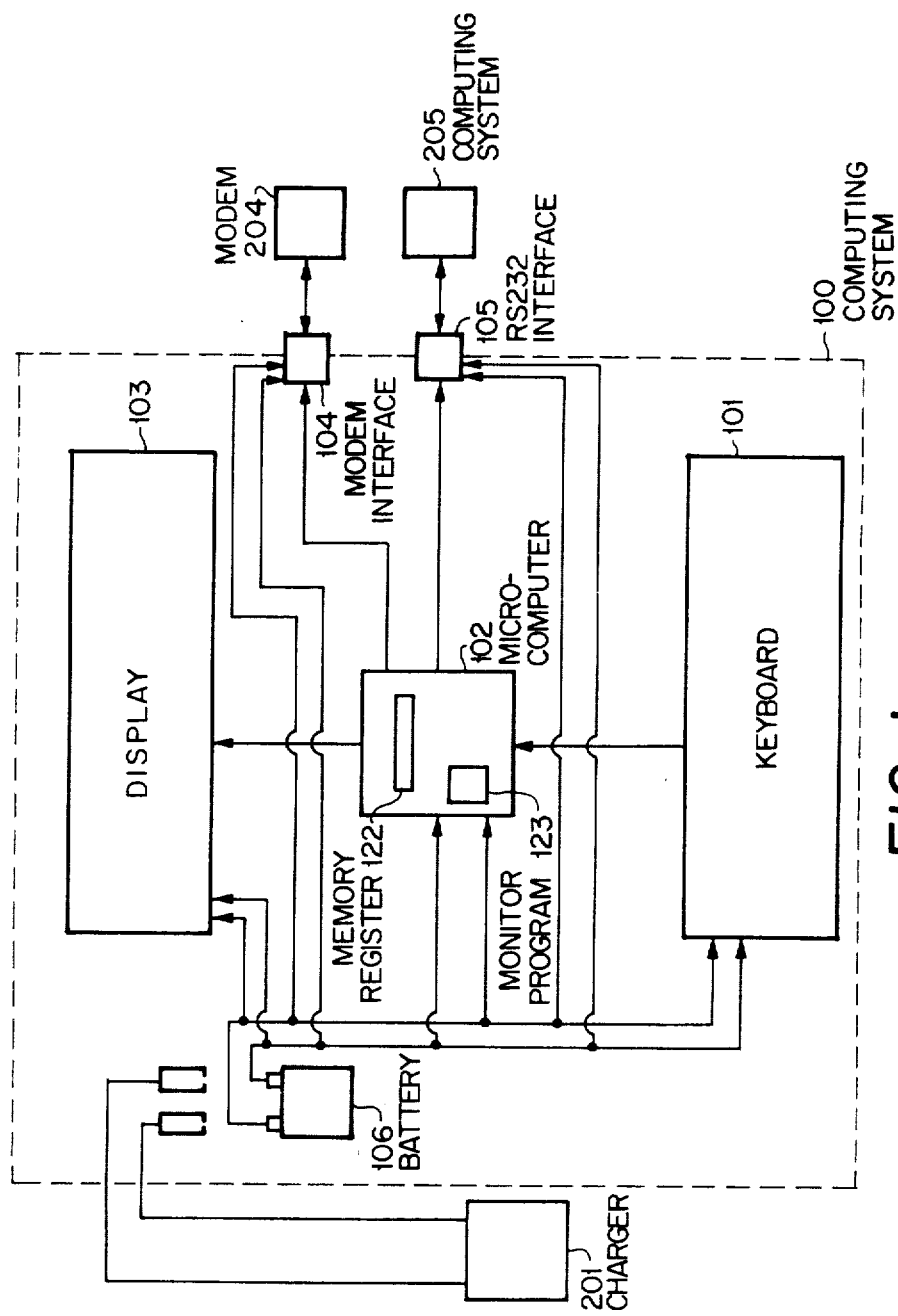
FIG. 1 is a block diagram of a computing system which performs battery charge level monitoring in accordance with the preferred embodiment of the present invention.

In FIG. 1, a microcomputer 102 within a computing system 100 calculates the charge within a battery 106. A value (FUEL) representing the current charge within the battery 106 is stored by mirocomputer 102 within a memory register 122. Value FUEL in register 122 is continually updated to accurately represent the current charge within battery 102.

Figure 2:
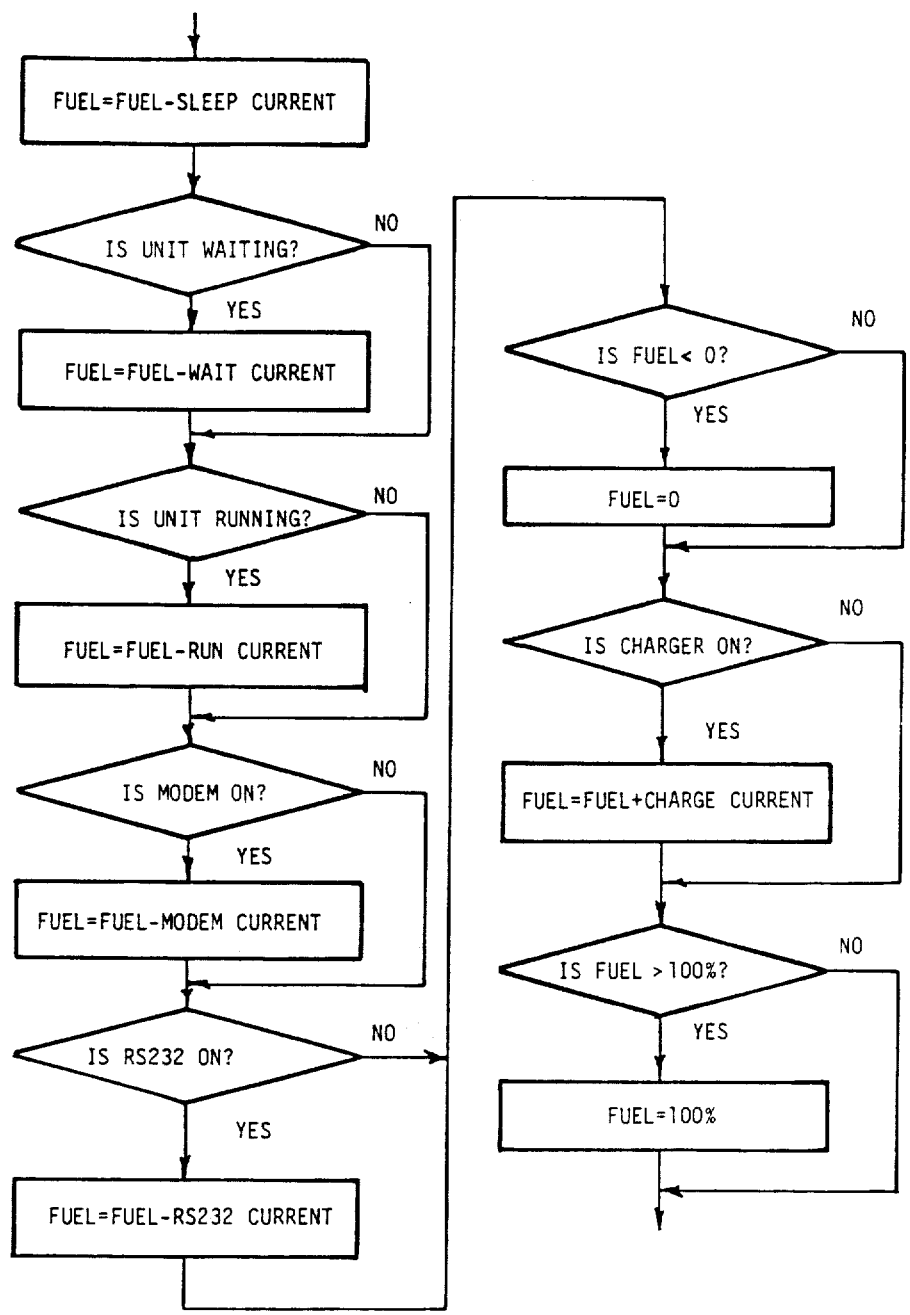
FIG. 2 is a flowchart of a battery charge level monitor in accordance with the preferred embodiment of the present invention.

For instance, in the preferred embodiment, every 128 milliseconds (ms) microcomputer 102 runs a monitor program 123—a flowchart of monitor program 123 is shown in FIG. 2. Monitor program 123 first subtracts from FUEL the minimum amount of charge consumed by computing system 100. This minimum charge may be calculated by multiplying the current (SLEEP CURRENT) used by computing system 100 when it is inactive (SLEEP) times 128 ms. In the flowchart of FIG. 2, this is represented by the operation FUEL = FUEL −− SLEEP CURRENT.

Monitor program 123 then takes into account the amount of additional charge consumed by computing system 100 for its other activities. The additional charge is subtracted from FUEL. If computing system 100 is active but in a wait mode, the additional charge is calculated based on the current (WAIT CURRENT) used by computing system 100 in wait mode. If computing system is performing an operation, the additional charge is calculated based on the current (RUN CURRENT) used by computing system 100 to perform the operation.

Monitor program 123 also may take into account the amount of charge consumed by computing system 100 in interfacing with other computing systems. For instance, if a modem interface 104 is interacting with a modem 204, monitor program 123 subtracts from FUEL an amount of charge based on the current (MODEM CURRENT) used by this interaction. If a RS232 cable interface 105 is interacting with another computing system 205, monitor program 123 subtracts from FUEL an amount of charge based on the current (RS232 CURRENT) used by this interaction.

Since battery 106 cannot store a negative charge, monitor program 123 will not store a value of FUEL less than 0. Additionally if a charger 201 is charging battery 106, monitor program will add to FUEL the average current (CHARGE CURRENT) battery 106 draws when it is charging. Finally, if battery is fully charged (FUEL = 100%), additional charging will not result in additional charge being stored so in battery 106, so monitor program 123 will not allow the value of FUEL to be over 100%.

An operator may obtain the current value of FUEL by entering an appropriate command on a keyboard 101. The current value of FUEL may then be presented on a display 103. Additionally if desired, computing system 100 may present the current value of FUEL at the end of each command given by the operator to the computing system.

Initial determination of when battery 106 is fully charged (FUEL = 100%) can be done at time of manufacture. This initial determination can be uitilized throughout the life of battery 106, or can be adjusted by microcomputer 100 to compensate for performance degradation resulting from aging of battery 106.

Appendix A is a copy of assembly source and object code of a version of monitor 123 written to run on a 6805 microprocessor built by Motorola Corporation of Tucscon, Ariz.

```
LOCATION OBJECT CODE LINE    SOURCE LINE

0128 B6 07       260 GAUGE    LDA FUEL+3        DELETE Sleep Current Here
012A B0 0D       261          SUB SLEEP_PWR+1
012C B7 07       262          STA FUEL+3
012E B6 06       263          LDA FUEL+2
0130 B2 0C       264          SBC SLEEP_PWR
0132 B7 06       265          STA FUEL+2
0134 B6 05       266          LDA FUEL+1
0136 A2 00       267          SBC #00
0138 B7 05       268          STA FUEL+1
013A B6 04       269          LDA FUEL
013C A2 00       270          SBC #00
013E B7 04       271          STA FUEL
0140 25 76       272          BCS EMPTY
0142 0A01 70     273          BRSET SLEEP,PORTB,GAUGE1
0145 B6 07       274          LDA FUEL+3        DELETE WAIT Current here
0147 B0 0B       275          SUB WAIT_PWR+1
0149 B7 07       276          STA FUEL+3
014B B6 06       277          LDA FUEL+2
014D B2 0A       278          SBC WAIT_PWR
014F B7 06       279          STA FUEL+2
0151 B6 05       280          LDA FUEL+1
0153 A2 00       281          SBC #00
0155 B7 05       282          STA FUEL+1
0157 B6 04       283          LDA FUEL
0159 A2 00       284          SBC #00
015B B7 04       285          STA FUEL
015D 25 59       286          BCS EMPTY
015F 0800 1A     287          BRCLR RUN,STATUS2,GAUGEN
0162 B6 07       288          LDA FUEL+3        DELETE RUN Current Here
0164 B0 09       289          SUB RUN_PWR+1
0166 B7 07       290          STA FUEL+3
0168 B6 06       291          LDA FUEL+2
016A B2 08       292          SBC RUN_PWR
016C B7 06       293          STA FUEL+2
016E B6 05       294          LDA FUEL+1
0170 A2 00       295          SBC #00
0172 B7 05       296          STA FUEL+1
0174 B6 04       297          LDA FUEL
0176 A2 00       298          SBC #00
0178 B7 04       299          STA FUEL
017A 25 3C       300          BCS EMPTY
017C 0201 1C     301 GAUGEN   BRSET MODEMON,PORTB,GAUGER
017F B6 07       302          LDA FUEL+3        DELETE MODEM Current Here
0181 B0 0F       303          SUB MODEM_PWR+1
0183 B7 07       304          STA FUEL+3
0185 B6 06       305          LDA FUEL+2
0187 B2 0E       306          SBC MODEM_PWR
0189 B7 06       307          STA FUEL+2
018B B6 05       308          LDA FUEL+1
018D A2 00       309          SBC #00
018F B7 05       310          STA FUEL+1
0191 B6 04       311          LDA FUEL
0193 A2 00       312          SBC #00
0195 B7 04       313          STA FUEL
0197 24 29       314          BCC GAUGE1
0199 25 10       315          BCS EMPTY
                 316
```

| LOCATION | OBJECT CODE | LINE | SOURCE LINE | | |
|---|---|---|---|---|---|
| 019B | 1503 24 | 317 | GAUGER | BRCLR ORIG,PORTD,GAUGE1 | RS-232 OFF |
| 019E | B6 07 | 318 | | LDA FUEL+3 | |
| 01A0 | B0 13 | 319 | | SUB RS232_PWR+1 | |
| 01A2 | B7 07 | 320 | | STA FUEL+3 | |
| 01A4 | B6 06 | 321 | | LDA FUEL+2 | |
| 01A6 | B2 12 | 322 | | SBC RS232_PWR | |
| 01A8 | B7 06 | 323 | | STA FUEL+2 | |
| 01AA | B6 05 | 324 | | LDA FUEL+1 | |
| 01AC | A2 00 | 325 | | SBC #00 | |
| 01AE | B7 05 | 326 | | STA FUEL+1 | |
| 01B0 | B6 04 | 327 | | LDA FUEL | |
| 01B2 | A2 00 | 328 | | SBC #00 | |
| 01B4 | B7 04 | 329 | | STA FUEL | |
| 01B6 | 24 0A | 330 | | BCC GAUGE1 | |
| 01B8 | A6 00 | 331 | EMPTY | LDA #00 | |
| 01BA | B7 04 | 332 | | STA FUEL | |
| 01BC | B7 05 | 333 | | STA FUEL+1 | |
| 01BE | B7 06 | 334 | | STA FUEL+2 | |
| 01C0 | B7 07 | 335 | | STA FUEL+3 | |
| 01C2 | 0400 24 | 336 | GAUGE1 | BRSET CHARGE,PORTA,IRQ | |
| 01C5 | B6 07 | 337 | | LDA FUEL+3 | ADD CHARGE Current Here |
| 01C7 | BB 11 | 338 | | ADD CHARGE_PWR+1 | |
| 01C9 | B7 07 | 339 | | STA FUEL+3 | |
| 01CB | B6 06 | 340 | | LDA FUEL+2 | |
| 01CD | B9 10 | 341 | | ADC CHARGE_PWR | |
| 01CF | B7 06 | 342 | | STA FUEL+2 | |
| 01D1 | B6 05 | 343 | | LDA FUEL+1 | |
| 01D3 | A9 00 | 344 | | ADC #00 | |
| 01D5 | B7 05 | 345 | | STA FUEL+1 | |
| 01D7 | B6 04 | 346 | | LDA FUEL | |
| 01D9 | A9 00 | 347 | | ADC #00 | |
| 01DB | B7 04 | 348 | | STA FUEL | |
| 01DD | 24 0A | 349 | | BCC IRQ | |
| 01DF | A6 FF | 350 | | LDA #0FFH | |
| 01E1 | B7 04 | 351 | | STA FUEL | |
| 01E3 | B7 05 | 352 | | STA FUEL+1 | |
| 01E5 | B7 06 | 353 | | STA FUEL+2 | |
| 01E7 | B7 07 | 354 | | STA FUEL+3 | |

I claim:

1. In a battery-powered computing system, a device for indicating battery charge level, the device comprising:

calculating means for computing a value related to the level of charge of the battery, the calculating means being operative to distinguish between predetermined operations involving the computing system and being arranged, in computing the value, to take into account the respective effect on battery charge level of each operation actually undertaken by the computing system utilizing a predetermined estimate of that effect to update a previous computation of the value; and, display means for displaying battery charge level based on the value related to the level of charge of the battery.

2. A device as in claim 1, wherein the calculating means includes a memory for storing the value related to the level of charge of the battery, the calculating means being arranged to compute at intervals an updated value by adjusting the value as stored in the memory by an amount corresponding to the change in battery charge caused as a result of operations performed by the battery-powered computing system since the last update.

3. A device as in claim 2, wherein during each update, the magnitude of adjustment to the value as stored in the memory is made based on a predetermined estimate of battery current caused by the operations performed by the battery-powered computing system and on the time interval since the last update.

* * * * *